(12) United States Patent
Bharath et al.

(10) Patent No.: US 12,538,425 B2
(45) Date of Patent: Jan. 27, 2026

(54) ELECTRICAL MODULE AND PRINTED CIRCUIT BOARD ASSEMBLY COMPRISING AN ELECTRICAL MODULE

(71) Applicant: Rolls-Royce Deutschland Ltd & Co KG, Blankenfelde-Mahlow (DE)

(72) Inventors: Subhashini Bharath, Munich (DE); Niklas Schamberger, Nuremberg (DE); Stanley Buchert, Herzogenaurach (DE); Uwe Waltrich, Forchheim (DE); Dipenkumar Patel, Erlangen (DE)

(73) Assignee: ROLLS-ROYCE DEUTSCHLAND LTD & CO KG, Blankenfelde-Mahlow (DE)

( * ) Notice: Subject to any disclaimer, the term of this patent is extended or adjusted under 35 U.S.C. 154(b) by 240 days.

(21) Appl. No.: 18/244,983

(22) Filed: Sep. 12, 2023

(65) Prior Publication Data

US 2024/0098899 A1    Mar. 21, 2024

(30) Foreign Application Priority Data

Sep. 15, 2022   (DE) ..................... 10 2022 123 589.0

(51) Int. Cl.
*H05K 1/00*   (2006.01)
*H05K 1/02*   (2006.01)
(Continued)

(52) U.S. Cl.
CPC ........... *H05K 1/141* (2013.01); *H05K 1/0209* (2013.01); *H05K 1/112* (2013.01)

(58) Field of Classification Search
CPC ....... H05K 1/141; H05K 1/0209; H05K 1/112
See application file for complete search history.

(56) References Cited

U.S. PATENT DOCUMENTS

2007/0267729 A1\* 11/2007 Otremba ............... H01L 23/492
257/E23.071
2016/0268185 A1    9/2016 Mcknight-macneil
(Continued)

FOREIGN PATENT DOCUMENTS

DE    102006005420 A1   9/2007
JP    H0982760 A         3/1997

OTHER PUBLICATIONS

German Office Action for German Patent Application No. 10 2022 123 589.0, dated Mar. 1, 2023, pp. 1-10.
(Continued)

*Primary Examiner* — Pete T Lee
(74) *Attorney, Agent, or Firm* — Lempia Summerfield Katz LLC

(57) ABSTRACT

An electrical module and a circuit board arrangement including an electrical module are disclosed. The electrical module includes an upper side and an underside, the upper side having four rectangularly arranged side edges, an electrical component embedded in the electrical module, and at least three electrical solder pads formed on the upper side configured to make electrical contact with the electrical component and configured to come into contact with an associated electrical solder pad of a circuit board via a solder layer. The solder pads of the electrical module are arranged in a symmetrical arrangement on the upper side of the electrical module, and/or the solder pads are arranged axially symmetrically on the upper side of the electrical module, and/or the solder pads extend along two opposite side edges on the upper side of the electrical module.

18 Claims, 9 Drawing Sheets

(51) Int. Cl.
*H05K 1/11* (2006.01)
*H05K 1/14* (2006.01)

(56) References Cited

U.S. PATENT DOCUMENTS

2019/0215964 A1\* 7/2019 Long .................. H05K 3/34
2022/0115283 A1 4/2022 Yamaguchi et al.

OTHER PUBLICATIONS

Extended European Search Report for Application No. EP23194657.5 mailed Feb. 8, 2024. (9 pages).

\* cited by examiner

ELECTRICAL MODULE AND PRINTED CIRCUIT BOARD ASSEMBLY COMPRISING AN ELECTRICAL MODULE

The present patent document claims the benefit of German Patent Application No. 10 2022 123 589.0, filed Sep. 15, 2022, which is hereby incorporated by reference in its entirety.

TECHNICAL FIELD

The disclosure relates to an electrical module and to a circuit board assembly having an electrical module.

BACKGROUND

Electrical modules are known that have an embedded semiconductor component and form electrical contacts on the outside of the electrical module for contacting the semiconductor component. For example, electrical modules are known in which an embedded semiconductor component is arranged on a ceramic circuit carrier that forms a metallization layer at high-voltage potential on an insulating ceramic layer and is coupled directly or via further layers to a heat sink. In this case, the ceramic circuit carrier, together with the semiconductor component and a sheath, for example, made of encapsulating material, forms an electrical module that may be connected to the carrier board or circuit board via contacts formed on its surface. Such electrical modules are also referred to as prepackage modules.

The arrangement of such prepackage modules on a carrier board is carried out via a soldering process in which solder pads assigned to each other on the prepackage module and on the circuit board are connected to each other via a solder layer. Owing to the principle involved, an air gap arises between the prepackage module and the circuit board during this process. The thickness of the solder layer determines the height of the air gap. Since the soldering process requires flux, flux residues remain in the air gap after the soldering process and is removed via a washing process before the air gap is subsequently cast with an insulation material in an underfill process. Complete cleaning of the air gap is absolutely necessary so that the subsequent potting may reliably fulfil its function as an insulator. However, the quality of the cleaning and the subsequent potting cannot be inspected or may only be inspected by destructive testing. For an optimal and reproducible underfill process, a clean air gap with a defined gap height is crucial. A minimum gap height is also required.

One problem with the arrangement of prepackage modules on a carrier board is a possible tilting of the prepackage modules on the underside of the carrier board during the soldering process. Tilting results in several disadvantages. For example, the thermal connection of the prepackage module to a heat sink deteriorates. The greater the tilt, the thicker the thermal interface material that is used between the prepackage module and the heat sink, which in turn has a negative effect on cooling. Furthermore, an air gap that varies in height makes a clean washing process and underfill process more difficult. The air gap between the prepackage module and the carrier board also takes into account any tilting of the prepackage module in order to realize the minimum gap height in each area, and therefore corresponding tolerances are provided. Another disadvantage is the potentially reduced service life of the solder connections.

SUMMARY AND DESCRIPTION

The object of the present disclosure is to provide an electrical module and a circuit board assembly which enable an electrical module to be arranged on a circuit board with the least possible tilting of the electrical module.

This object is achieved by an electrical module and a circuit board assembly as described herein. The scope of the present disclosure is defined solely by the appended claims and is not affected to any degree by the statements within this summary. The present embodiments may obviate one or more of the drawbacks or limitations in the related art.

In a first aspect, an electrical module including an embedded electrical component is provided. The electrical module includes an upper side and an underside, the upper side having four rectangularly arranged side edges. Furthermore, the electrical module includes at least three electrical solder pads formed on the upper side, which are configured to make electrical contact with the electrical component and configured to come into contact with an associated electrical solder pad of a circuit board via a solder layer.

It is provided that the solder pads of the electrical module are arranged in a symmetrical arrangement on the upper side of the electrical module, wherein the solder pads are arranged axially symmetrically on the upper side of the electrical module and/or all solder pads extend along two opposite side edges on the upper side of the electrical module.

The solution is based on the idea of preventing or reducing tilting of the electrical module on a circuit board by the design of the solder pads. Thus, an axially symmetrical arrangement of the solder pads or an arrangement limited to two opposite side edges is provided, which causes the solder material used in the soldering process to also be symmetrical with respect to the dimensions of the electrical module between the electrical module and an adjacent circuit board. This minimizes tilting of the electrical module arranged on the underside of a circuit board by a soldering process.

Another advantage associated with the solution is that a largely constant gap height of the gap between the electrical module and the circuit board also allows a washing process and underfill process following the soldering process to be optimized. In particular, uniform potting is possible, for example, with an underfill material between the electrical module and a circuit board. Likewise, the reduced tilt of the electrical module provides an easier thermal connection of the electrical module to a heat sink. The present disclosure thus provides an optimized design of the electrical module for the soldering process, the washing process, and the potting process.

One embodiment provides that the solder pads are elongate and at least two of the solder pads are arranged parallel to each other. The elongate and parallel arrangement of the solder pads allows washing agent to flow in a flow direction in the air gap between the electrical module and the circuit board during the washing process. Due to the substantially constant gap height, there is substantially identical flow resistance between the solder pads. The use of different flow directions for cleaning the gap is not necessary.

In another embodiment, three solder pads are arranged axially symmetrically on the upper side of the electrical module such that one solder pad extends along a center line (which is an axis of symmetry of the rectangular upper side), and the other two solder pads extend along the side edges opposite the center line. This provides a stable symmetrical structure that minimizes the risk of tilting.

According to another embodiment, four solder pads are arranged axially symmetrically on the upper side of the electrical module in such a way that two solder pads extend adjacently to a center line and two solder pads extend along the side edges opposite the center line. For example, the same potential, such as a source potential, is applied to the two middle solder pads arranged adjacently to the center line. Such a design makes it possible to provide enlarged source or other contacts without deviating from a symmetrical arrangement.

Another embodiment provides that all solder pads extend along two opposite side edges in such a way that the same number of solder pads extend along each of the opposite side edges. According to this embodiment, there is complete symmetry of the solder pads with respect to their arrangement on two opposite side edges. Since the solder pads on opposite side edges are maximally spaced from each other, the risk of tilting is minimized in a special way with this embodiment.

A distinction may be made between the number of solder pads and the number of electrical potentials applied to the solder pads. In certain applications, three electrical potentials are provided and are to be applied to the embedded semiconductor component, for example a gate potential, a source potential, and a drain potential. The corresponding potentials are provided via a circuit board. The number of solder pads may likewise be three but may also be larger. In the latter case, the same potential is applied to several solder pads. In this way, there is additional freedom to realize symmetrical arrangements of the solder pads.

In certain examples, each solder pad has the same surface area. This means that the same solder paste volume is applied to the solder pads when the electrical module is arranged on a circuit board and identical solder layer heights are realized, so that the risk of tilting is minimized. It may be provided that the solder paste is liquefied at the individual solder pads at the same or similar times. One embodiment provides that the solder pads all have the same width, so that they are exactly identical in shape.

According to a further embodiment, it is provided that all solder pads extend along two opposite side edges in such a way that one of the solder pads is arranged on one side edge and the other solder pads are arranged one behind the other along the opposite side edge. In order to nevertheless achieve a symmetrical distribution of the solder paste, it may be provided in such a case that the sum of the areas of the solder pads extending along the one side edge is equal to the area of the solder pad extending along the one side edge. The individual solder pads have identical widths. The volumes of the solder pastes or solder layers are also identical to the areas.

In such an embodiment, it may be provided in particular that a drain contact is provided by the solder pad on one side edge and a source contact as well as a gate contact are provided by solder pads on the other side edge, so that the drain contact and the source contact are spatially arranged opposite each other. At the same time, the source contact and the gate contact are aligned with each other.

In another embodiment, the areas of the three solder pads are in such a ratio to one another that one of the solder pads (for example, the gate contact) has a smallest area and the other two solder pads each have a multiple of this smallest area (for example, the source contact having twice the smallest area and the drain contact having three times the smallest area).

In certain examples, the feature that a solder pad extends along a side edge does not necessarily mean that the solder pad extends exactly to the side edge. Rather, it may also be provided that there is a slight, constant distance between the side edge and the solder pad. However, the respective solder pad is located closer to the side edge than to the center line.

Further embodiments of the electrical module provide for vias extending from the solder pads into the interior of the electrical module, which extend to an inner metallization layer of the electrical module or to contacts on the upper side of the electrical component. The position of the contacts on the upper side of the electrical component also determines the basic position of the associated solder pads because no rewiring takes place inside the electrical module.

As already mentioned, it may be provided that the at least three solder pads of the electrical module are charged with a drain potential, a source potential, and a gate potential. It may be further provided that a source potential is applied to the solder pad extending along one side edge and that a drain potential is applied to the solder pad extending along the other side edge. As is yet to be explained, such a voltage application to the solder pads allows two adjacent electrical modules, which are components of two switches, to be connected in a half-bridge circuit in a simple manner. For such a voltage application, it is necessary to orient the embedded electrical component in the module so that its surface contacts provided for a source connection and a drain connection are positioned accordingly.

For example, the electrical module is configured in such a way that the electrical module includes a ceramic circuit carrier having an insulating ceramic layer and a first metallization layer disposed on the upper side of the ceramic layer, wherein the electrical component is disposed on and electrically connected to the upper side of the first metallization layer. Further, the electrical contacts of the module include a first via, which extends from a solder pad on the upper side to the first metallization layer, and second and third vias, which extend from other solder pads on the upper side to corresponding contacts on the upper side of the electrical component.

The electrical component integrated in the electrical module may be a semiconductor component, in particular a power semiconductor such as a power MOSFET or an IGBT component. This may be a power semiconductor of an inverter or of a power converter provided for the operation of an electric motor.

In another aspect, a circuit board assembly having a circuit board and at least one electrical module is provided. In this regard, electrical solder pads are formed on the underside of the circuit board and are associated with the electrical solder pads on the upper side of the electrical module, the respective solder pads being electrically connected via a solder layer. A gap between the upper side of the electrical module and the underside of the circuit board is closed by a potting material.

For the purposes of the present disclosure, the side of the circuit board on which the electrical module is arranged is referred to as the underside of the circuit board, irrespective of the actual orientation of the circuit board and the module in space.

One embodiment of the circuit board assembly provides that the electrical modules each have at least three solder pads, wherein at least one solder pad extends on each of two opposite side edges. Additionally, the electrical modules are arranged in two rows on the circuit board and in each case two adjacent electrical modules of the two rows are aligned in such a way that the side edges provided with solder pads are aligned with one another and extend perpendicularly to the longitudinal direction of the respective row. Further, a washing agent flow may be realized through each two adjacent electrical modules of the two rows at an intermediate stage of the manufacture of the circuit board assembly, the washing agent flow being able to extend between the circuit board and the upper side of the electrical module and thereby between the solder pads formed at the opposite side edges. In this case, the electrical components embedded in the electrical module are to be aligned in such a way that the solder pads are oriented accordingly.

This variant makes it possible to avoid time-consuming washing processes after the soldering process and at the same time to provide reliable cleaning of the air gap between the electrical module and the circuit board. This results in a flow direction for the washing agent between opposite side edges and the solder pads of the respective module arranged there, with the washing agent flowing through two adjacent modules in each case during the washing process. Since only two of the electrical modules arranged in two rows (one module from each row) are passed through by a washing agent flow, this results in a relatively short distance for the washing agent flow and thus effective cleaning by the washing agent compared to an alternative design in which all electrical modules of a row are cleaned and rinsed by a washing agent stream. In the latter case, significantly longer distances are required for rinsing all adjacent electrical modules. A further advantage associated with this design is that the arrangement of the solder pads leads to parallel contact area regions for the adjacently arranged electrical modules. This prevents shadowing effects and thus "blind" spots where the washing agent cannot reach.

The washing processes explained take place at a time when the circuit board assembly is not yet finished, namely after the soldering process and before the underfill process. Nevertheless, this is a feature of the finished circuit board assembly that uses solely the position of the solder pads on the upper side of the electrical module to define in what way the washing process may take place.

One embodiment provides that the electrical modules each have three solder pads extending along a center line and two side edges, with two adjacent electrical modules of each of the two rows being aligned such that the two solder pads extending along the center line are also aligned with each other. Thus, two parallel flows for a washing agent are created between the upper side of the electrical module and the underside of the circuit board via the solder pads and the solder material applied to them.

A further embodiment provides that the at least three solder pads of each electrical module have a source potential, a drain potential, and a gate potential applied thereto. Additionally, two adjacent electrical modules of a row are each aligned in such a way that a solder pad of the one electrical module to which a source potential is applied, arranged on one side edge, does not adjoin a solder pad on the adjacent side edge of the adjacent electrical module to which a drain potential is applied.

To achieve this, it may be provided that for two adjacent electrical modules of a row it is true in each case that one electrical module is arranged rotated by 180° relative to the other electrical module. Accordingly, the respective electrical components embedded in the electrical module are also to be rotated by 180° relative to each other.

This embodiment is based on the realization that the greatest clearances and creepage distances are required for electrical isolation between the drain terminal and the source terminal of an electrical module of a logic switch. By way of this alignment of drain terminal and source terminal on the electrical module, a large distance is naturally established between these terminals, since in this arrangement two drain terminals or two source terminals adjoin each other at the adjacent side edges of two adjacent electrical modules. This means that no additional spacing is required from the insulation coordination.

A further embodiment provides that the at least three solder pads of the respective electrical module are supplied with a source potential, a source potential, and a gate potential, wherein the solder pad extending along one side edge is supplied with a drain potential and the solder pad extending along the other side edge is supplied with a source potential. It is further provided here that the electrical modules are arranged in two rows on the circuit board and in each case two adjacent electrical modules of the two rows are aligned in such a way that a solder pad of the one electrical module to which a drain potential is applied, arranged on one side edge, adjoins a solder pad on the adjacent side edge of the adjacent electrical module to which a source potential is applied. In this case, the electrical components embedded in the respective electrical module are to be aligned in such a way that the solder pads are oriented accordingly.

This design allows two electrical modules to be connected to each other without time-consuming rewiring in the circuit board, in particular for realizing a half-bridge circuit. A drain contact and a source contact of two adjacent electrical modules may be connected here to the same potential without having to change the wiring in the circuit board.

In embodiments of the disclosure, the rows of electrical modules each form a logic switch. It may be provided here that the switches are interconnected via a corresponding wiring in the circuit board to form a half-bridge circuit in which the drain contact of one switch and the source contact of the other switch are at the same potential.

BRIEF DESCRIPTION OF THE DRAWINGS

The disclosure is now explained in more detail below on the basis of multiple exemplary embodiments with reference to the figures of the drawing. In the figures.

DETAILED DESCRIPTION

Figure 19:
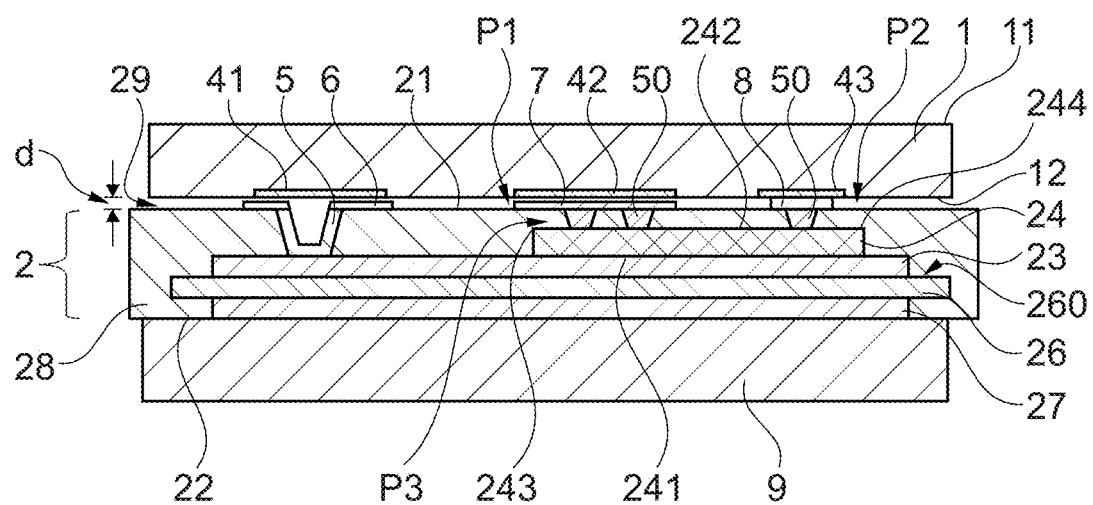
FIG. 19 depicts an example of a circuit board assembly having a circuit board and an electrical module.

To give a better understanding of the present disclosure, the structure of a circuit board assembly is described first by way of example with reference to FIG. 19.

FIG. 19 shows a circuit board assembly, which includes a circuit board 1 and an electrical module 2. The circuit board 1 includes an upper side 11 and an underside 12. A plurality of solder pads 41, 42, 43 is provided on the underside 12 for contacting the electrical module 2.

The electrical module 2 has an upper side 21 and an underside 22. The electrical module 2 includes a ceramic circuit carrier 260, an electrical component 24, and electrical contacts 6, 7, 8, which are arranged on the upper side 21 of the module 2. The ceramic circuit carrier 260 includes an insulating ceramic layer 26, a metallization layer 23 arranged on the upper side of the ceramic layer 26, and a further metallization layer 27 arranged on the underside of the ceramic layer 26. The ceramic layer 26 may include aluminum nitride (AlN) or silicon nitride ($Si_3N_4$). The metallization layers 23, 27 may include copper, aluminum, silver, or tungsten.

On the metallization layer 23, the electrical component 24 is arranged via a solder layer (not shown separately). The component 24 has an underside 241 with which it is arranged on the metallization layer 23, and an upper side 242. The component thus has a thickness given by the distance between the upper side 242 and the underside 241. The upper side 242 and the underside 241 may be metallized, for example, copper-plated. The electrical component 24 may be a power semiconductor configured as a chip.

The ceramic circuit carrier 260 and the electrical component 24 are arranged in a substrate 28, which defines the external dimensions of the electrical module 2. In one variant embodiment, the substrate 28 is a potting compound, in which the ceramic circuit carrier 260 and the electrical component 24 are embedded. Alternatively, the substrate 28 is a circuit board, for which case the ceramic circuit carrier 260 and the electrical component 24 have been embedded in a circuit board in a circuit board embedding process.

The electrical component 24 is configured as an embedded component, e.g., the upper side 242 of the electrical component 24 is spaced from the upper side 21 of the electrical module.

The substrate 28 includes an upper side, which also forms the upper side 21 of the module 2. The underside of the substrate 28 extends flush with the lower metallization layer 27, which forms the underside 22 of the module 2. The ceramic circuit carrier 260 with the lower metallization layer 27 may be connected to a heat sink 9, directly or via a heat-conducting mat not shown. Waste heat of the electrical component 24 is dissipated via the heat sink 9.

The electrical contacts 6, 7, 8 on the upper side 21 of the module are provided by solder pads, also known as solder contacts. The solder pads 6, 7, 8 are electrically connected via solder connections (not shown) to the solder pads 41, 42, 43 of the circuit board 1. For example, a drain terminal is provided via the solder pad 6. Additionally, a source terminal and a gate terminal of the electrical component 24 are provided via the solder pads 7, 8.

Thus, there is in principle a gap 29 between the upper side 21 of the module 2 and the underside 12 of the circuit board 1. The solder layer thickness determines the height d of the gap 29. After the soldering process, in which the module 2 is soldered to the circuit board 1, the gap 29 forms an air gap. In a washing process following the soldering process, the air gap is cleaned of flux residues by a washing agent. Subsequently, the gap 29 is filled with an insulating potting material in an underfill process. The height d of the gap 29 may be as constant as possible so that these processes may be carried out effectively.

Starting from the solder pad 6, vias 5 extend to the upper metallization layer 23 of the ceramic circuit carrier 260. Further, vias 50 extend from the solder pads 7, 23 to the upper side 242 of the electrical component 24. A platedthrough hole or via refers to a through hole metallized on the inside. In each case, a quite large number of vias 5, 50 may be provided, which are arranged one behind the other and are therefore not visible in the sectional view of FIG. 19.

The module 2 has an overall cuboid shape so that the upper side is rectangular and has four side edges, two of which are parallel to each other.

In the following, the arrangement of the solder pads 6-8 on the electrical module 2 is considered, which is shown only schematically in FIG. 19.

Figure 1:
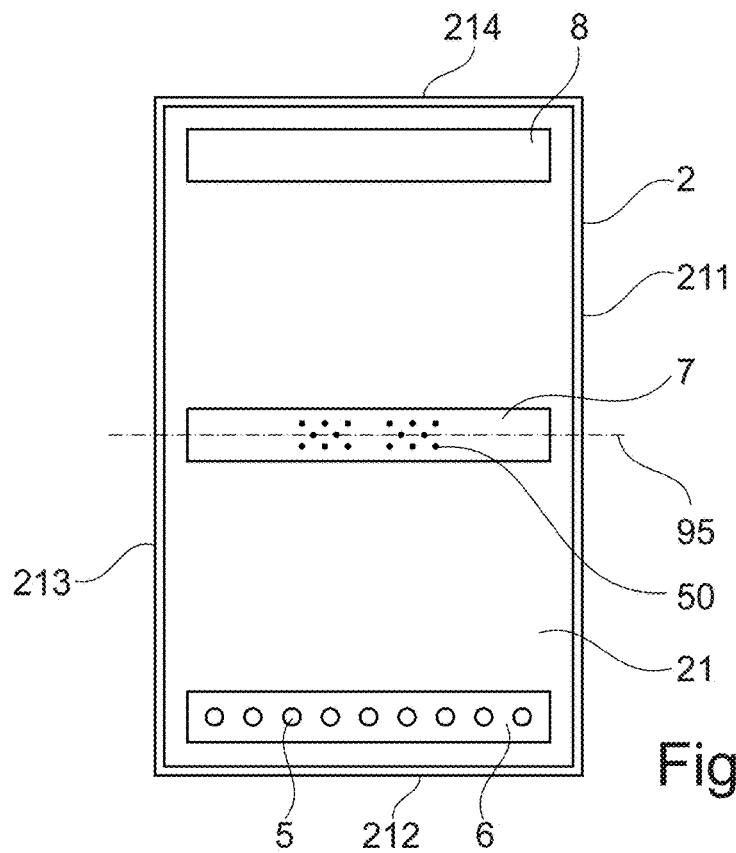
FIG. 1 depicts a plan view of the upper side of an exemplary embodiment of an electrical module, wherein the upper side of the electrical module has three symmetrically arranged solder pads.

FIG. 1 shows a plan view of the upper side 21 of an electrical module 2, which has an embedded electrical component (corresponding, for example, to the electrical component 24 of FIG. 19). The electrical module 2 is cuboidal in shape, so that the upper side 21 has four side edges 211-214, two of which are arranged parallel to one another in each case. The upper side 21 naturally has two center lines or axes of symmetry, with one of the center lines 95 being shown.

Three solder pads 6, 7, 8 are arranged axially symmetrically on the upper side 2. One solder pad 7 is located on the center line 95 and the other two solder pads 6, 8 are each arranged adjacently to one of the side edges 212, 214, so that there is an overall axial symmetry in the arrangement of the solder pads. The individual solder pads 6, 7, 8 have the same length and the same width and thus also the same area. They are elongate and run substantially over the entire width of the respective solder pad, although this is not necessarily the case. The solder pads 6, 8 may run exactly along the side edge 212, 214 or, as shown in FIG. 1, at a certain distance from the respective side edge 212, 214. The solder pads 6, 7, 8 also run parallel to each other.

FIG. 1 also shows that vias extend from the solder pads into the interior of the module. Thus, vias 5 assigned to solder pad 6 and vias 50 assigned to solder pad 7 are shown schematically and serve to contact the embedded electrical component in accordance with the vias 5, 50 of FIG. 19.

The solder pads 6, 7, 8 do not necessarily have to have the shown arrangement and shape from the outset. For example, it may be provided that the solder pads have been formed with a larger area on the upper side 21 of the electrical module 2, in which case the desired and depicted shape is then produced by subsequently applying a solder paste to the solder pads. Alternatively, the solder pads 6, 7, 8 are formed in the illustrated shape on the upper side 21 of the electrical module 2 from the outset. This also applies in a corresponding manner to FIGS. 2 to 14.

Figure 2:
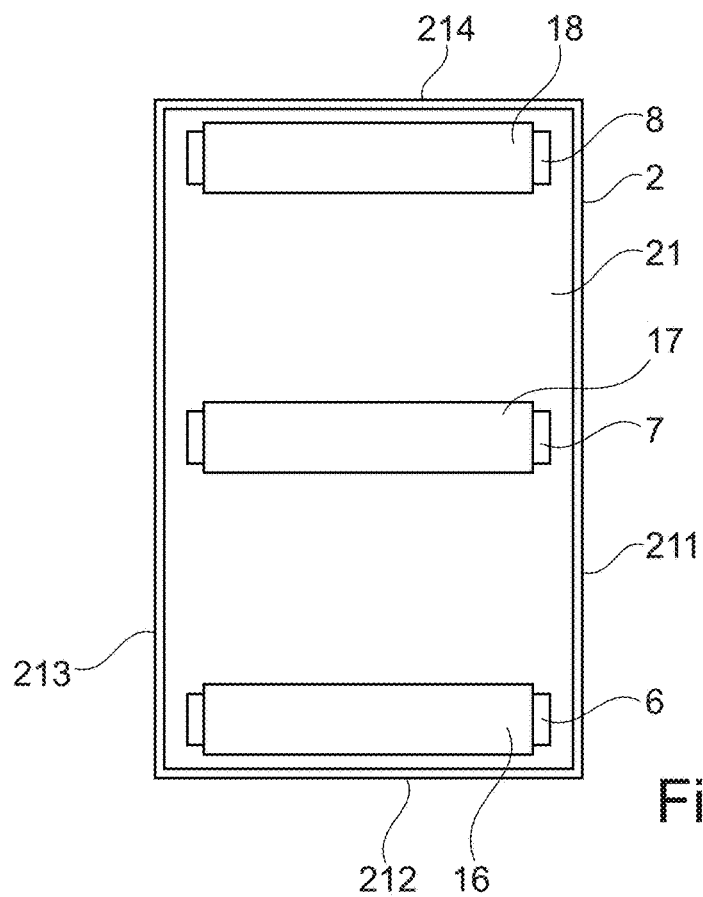
FIG. 2 depicts the electrical module of FIG. 1, wherein a solder layer is applied to each of the solder pads.

FIG. 2 shows the electrical module of FIG. 1 with an additional representation of solder layers 16, 17, 18, which are arranged on the respective solder pads 6, 7, 8. Via the solder layers 16, 17, 18, the electrical module 2 is electrically connected to a circuit board corresponding to the circuit board 1 of FIG. 19. Since the solder pads 6, 7, 8 each have the same area, they may be provided with the same volume of solder paste, so that the solder layers 16, 17, 18 also have exactly the same volume and thus the same height, so that the electrical module 2 may be arranged on a circuit board with little tilting. It may also be provided that the respective solder paste is liquefied at the same or similar times in the soldering process, which further reduces a possible tilting of the electrical module 2.

Figure 3:
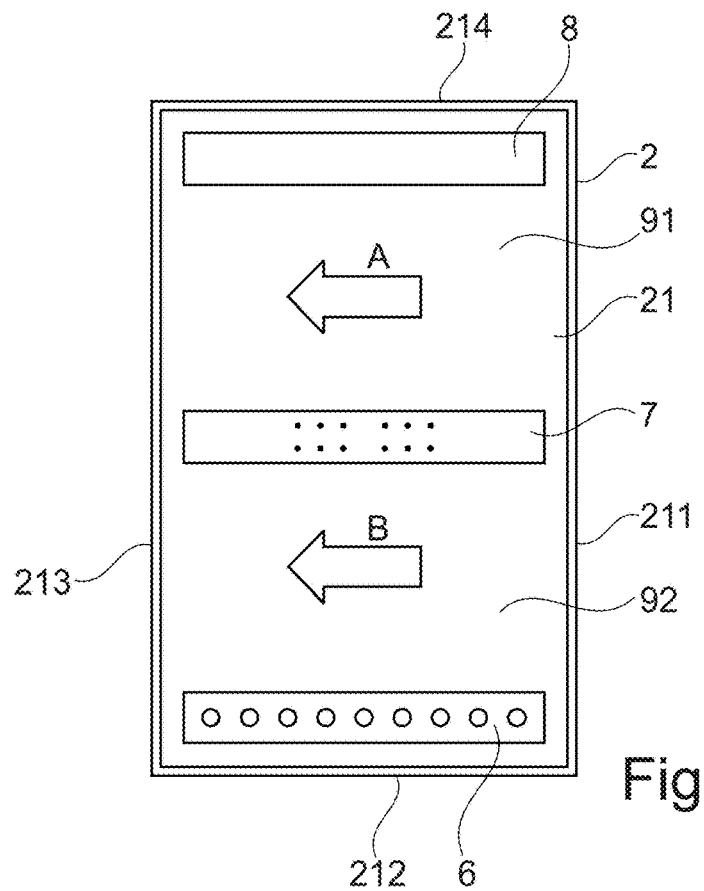
FIG. 3 depicts the electrical module of FIG. 1, wherein flow paths of a washing agent flowing between the upper side of the module and an adjacent circuit board during a washing process are shown schematically.

FIG. 3 illustrates that the configuration of the solder pads 6, 7, 8, according to FIG. 1, provides two flow channels 91, 92, which are formed between the respective edge solder pad 6, 8 and the central solder pad 7. In the flow channels 91, 92, a washing agent may flow with a flow direction A, B, which, as explained with reference to FIGS. 19, serves to clean an air gap that exists between the electrical module 2 and a circuit board after the soldering process for connecting them and is contaminated with flux residues from the soldering process. Due to the axially symmetrical arrangement of the solder pads, identical flow resistances are present in the two flow channels 91, 92, e.g., the air gap to be cleaned is divided into two identical chambers. Only one flow direction A, B needs to be provided for a washing agent. The solder pads 6, 7, 8 are thus optimally aligned for the washing process. This also applies to a potting process following the washing process.

The solder pads 6, 7, 8 of FIGS. 1-3 may be supplied with a drain potential, a source potential, and a gate potential, wherein the embedded electrical component of the electrical module is, for example, a power semiconductor. The solder pads 6, 7, 8 to which a corresponding voltage is applied are hereinafter also referred to as drain terminal, source terminal, and gate terminal or source contact, drain contact, and gate contact. As explained below, it is possible to apply a certain potential to several solder pads.

Figure 4:
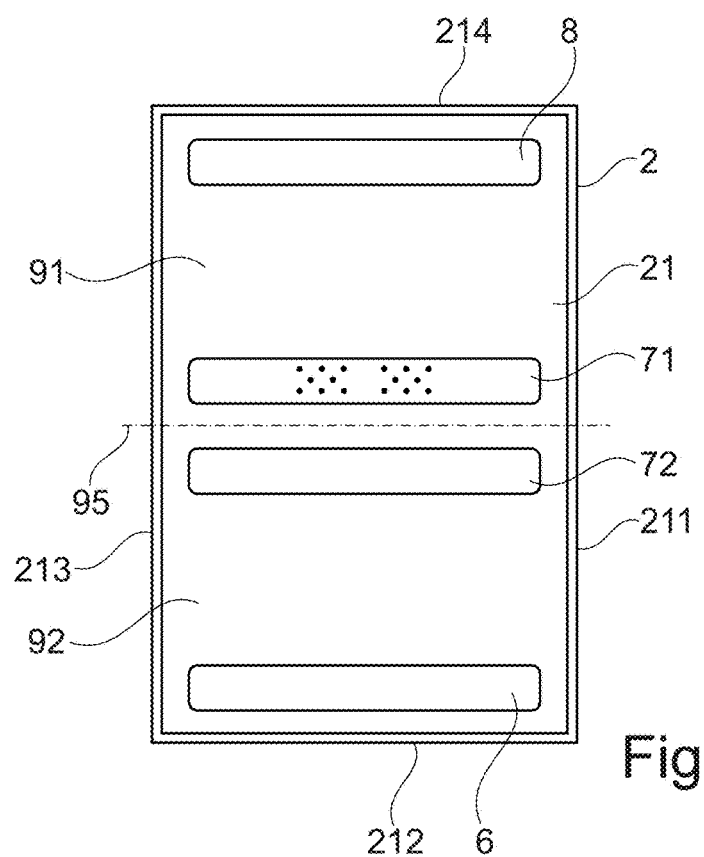
FIG. 4 depicts a plan view of the upper side of a further exemplary embodiment of an electrical module, wherein the upper side of the electrical module has four symmetrically arranged solder pads.

FIG. 4 shows an exemplary embodiment in which an axially symmetrical arrangement of solder pads on the upper side 21 of an electrical module 2 is realized in that two solder pads 71, 72 run adjacently to the center line 95 and two further solder pads 6, 8 extend along the side edges 212, 214 opposite the center line 95. For example, the solder pad 6 forms a drain contact, the solder pads 71, 72 form source contacts, and the solder pad 8 forms a gate contact. Also in such an embodiment, two substantially identical flow channels 91, 92 are provided for a washing agent.

Figure 5:
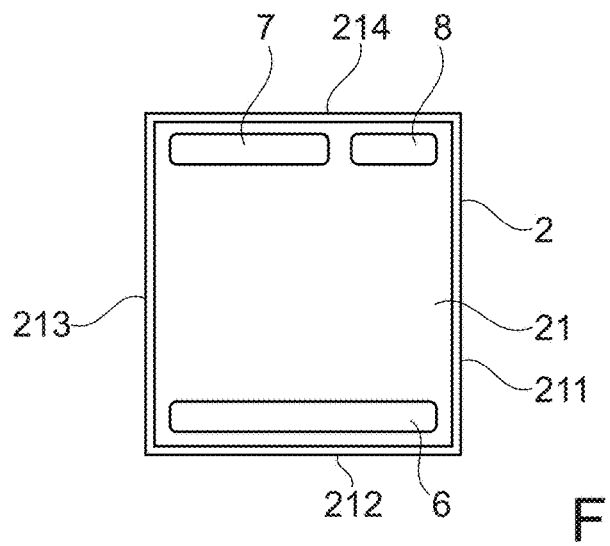
FIG. 5 depicts a plan view of the upper side of a further exemplary embodiment of an electrical module, wherein the upper side of the electrical module has a solder pad on one side edge and two solder pads on the opposite side edge.

FIG. 5 shows a further exemplary embodiment of a symmetrical arrangement of solder pads on the upper side of an electrical module. Thus, in the embodiment of FIG. 5, a total of three solder pads 6, 7, 8 are provided, wherein one solder pad 6 extends along one side edge 212 and the other two solder pads 7, 8 extend along the opposite side edge 214. The two other solder pads 7, 8 are arranged one behind the other along the side edge 214. It is intended that the sum of the areas of the two solder pads 7, 8 is equal to the area of the solder pad 6. This provides an equal distribution of the solder paste on both side edges 212, 214.

The individual solder pads 6, 7, 8 have the same width. The areas of the three solder pads 6, 7, 8 are in such a ratio to one another that solder pad 7 has twice the area of solder pad 8 and solder pad 6 has three times the area of solder pad 8. The solder pads 6 and 7 therefore each have a multiple of the area of the solder pad 8.

Also, in the exemplary embodiment of FIG. 5, the solder pad 6 forms a drain contact, the solder pad 7 forms a drain contact and the solder pad 8 forms a gate contact. Accordingly, the source contact and the drain contact are arranged spatially opposite each other.

Figure 6:
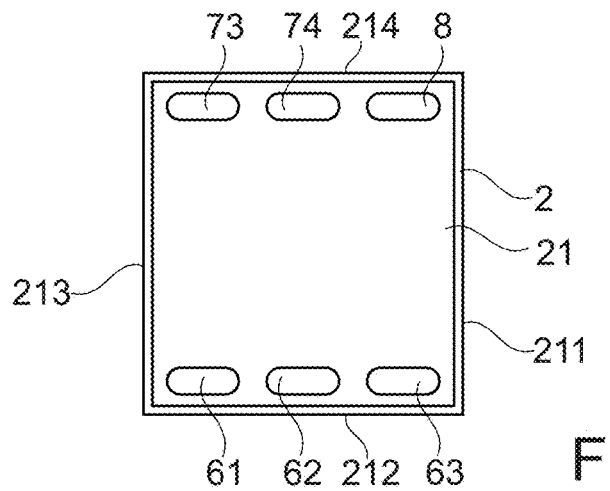
FIG. 6 depicts a plan view of the upper side of a further exemplary embodiment of an electrical module, wherein the upper side of the electrical module has three solder pads on one side edge and three further solder pads on the opposite side edge.

FIG. 6 shows a further exemplary embodiment that corresponds in its basic structure to the exemplary embodiment in FIG. 5, but in which the gate contact has been segmented into three solder pads 61, 62, 63 and the source contact into two solder pads 73, 74. This results in complete symmetry with respect to the center axis and a symmetrical distribution of the solder pads and associated solder layers on two side edges 212, 214.

Figure 7:
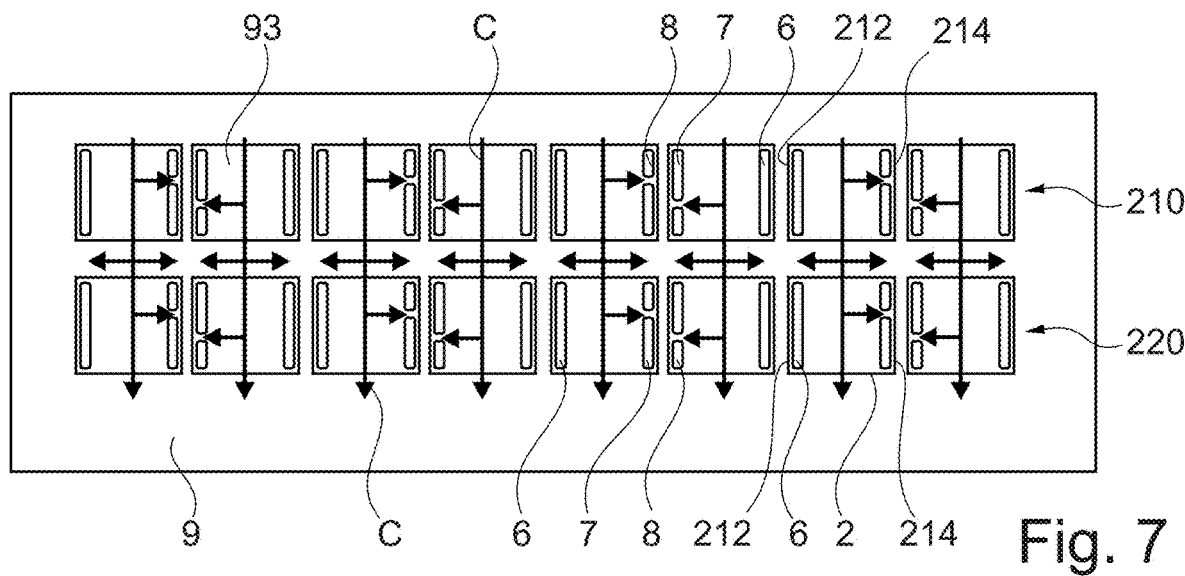
FIG. 7 depicts, in a plan view, an arrangement of electrical modules according to FIG. 5, wherein the electrical modules are arranged in two parallel rows forming two electrical switches.

FIG. 7 shows a plurality of electrical modules 2 designed as shown in FIG. 5. The electrical modules 2 are arranged in two parallel rows 210, 220. Each row 210, 220 of modules 2 forms a logic switch, for example, a logic switch in an inverter or converter. In the plan view shown, a heat sink 9 may be seen on which the electrical modules are arranged as shown in FIG. 19. A circuit board is arranged on the upper side of the electrical modules as shown in FIG. 19, but this is not shown in FIG. 7.

The electrical modules 2 are oriented in such a way that the solder pads of an electrical module 2 of one row 210 are aligned with the solder pads of the adjacent electrical module 2 of the other row 220 and extend perpendicular to the longitudinal direction of the respective row 210, 220. Thus, the side edges 214 forming the solder pads 7, 8 of FIG. 5 are aligned. Furthermore, the side edges 212, which form the solder pads 6 of FIG. 5, are aligned. This arrangement results in flow channels 93 of a flow direction C for a washing agent, each extending through two adjacent modules of the two rows 210, 220 and in each module between the solder pads. This realizes short washing agent distances that allow an effective cleaning of the gap between electrical module 2 and circuit board 1 after the soldering process. If, on the other hand, the electrical modules 2 in the two rows 210, 220 were each rotated by 90°, it would be necessary to implement washing agent paths that each extend through an entire row of electrical modules and would be considerably less effective.

Figure 8:
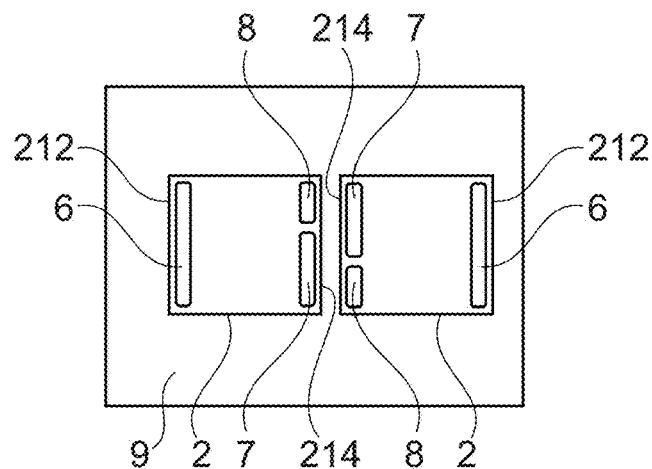
FIG. 8 depicts a representation of two electrical modules of FIG. 7 arranged in a row next to each other, wherein the solder pads of the electrical modules are supplied with a gate voltage, a source circuit, and a drain circuit in such a way that the solder pads supplied with a source voltage are formed on adjacent side edges of the two modules.

Another special feature of the arrangement of the electrical modules 2 in FIG. 7 is illustrated in FIG. 8, which shows two of the modules in a row. According to this, in the case of two electrical modules 2 of a row, one of these electrical modules is arranged rotated by 180° to the other electrical module 2. This results in the solder pads 7, 8, which form a source contact and a gate contact, being arranged on side edges 214 of the two modules 2 facing one another. The solder pads 6, which each form a drain contact, are formed on the side edges 212 facing away from one another. This prevents a solder pad to which a source potential is applied from being directly adjacent to a solder pad to which a drain potential is applied. Instead, in the arrangement according to FIG. 8, the largest possible clearance and creepage distance is realized between these contacts in a natural way.

Figure 9:
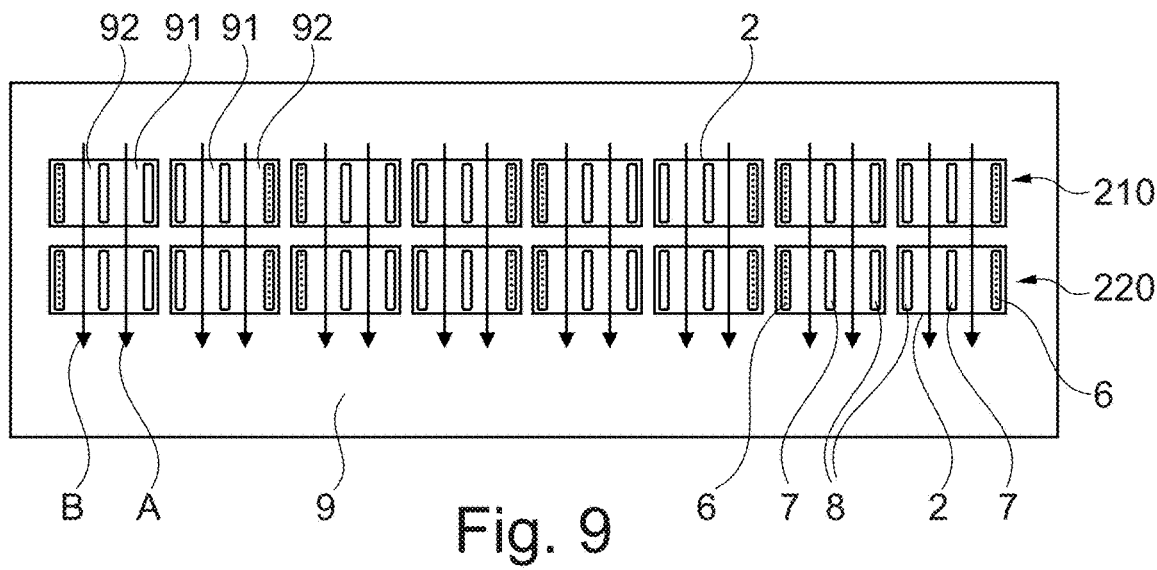
FIG. 9 depicts, in a plan view, an arrangement of electrical modules according to FIG. 1, wherein the electrical modules are arranged in two parallel rows forming two electrical switches.

FIG. 9 shows a circuit board assembly with a plurality of electrical modules 2, which are arranged in two rows 210, 220 according to the arrangement in FIG. 7. The individual electrical modules 2 are provided here with solder pads on their upper side, which are designed as shown in FIG. 1, so that a central solder pad 7 and two solder pads 6, 8 extending along two opposite side edges 212, 214 are provided in each case. Here, the orientation of the side edges and solder pads is as shown in FIG. 7, i.e., the solder pads each extend perpendicular to the longitudinal direction of the respective rows 210, 220. This results in two parallel flow channels 91, 92 with identical flow directions A, B for a washing agent, each extending through two adjacent modules of the two rows 210, 220 and in each module between the solder pads. In this respect, reference is also made to the explanations relating to FIG. 3. This, in turn, realizes short washing agent distances that allow an effective cleaning of the gap between the electrical modules 2 and a circuit board after the soldering process.

Figure 10:
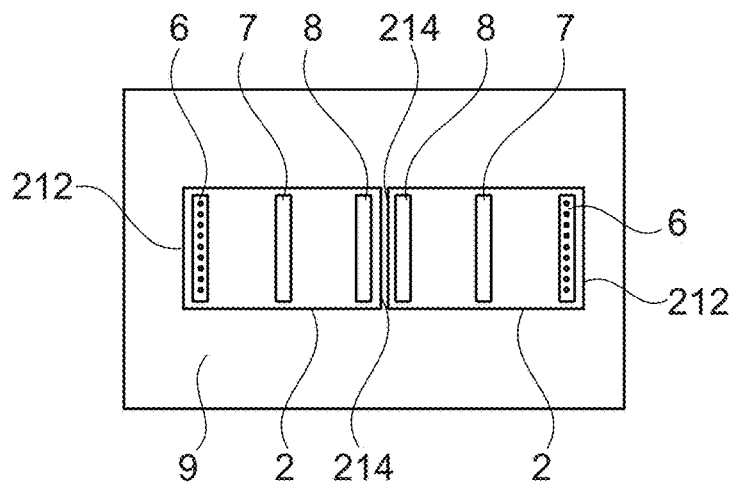
FIG. 10 depicts a representation of two electrical modules of FIG. 9 arranged in a row next to each other, wherein the solder pads of the electrical modules are supplied with a gate voltage, a source circuit, and a drain circuit in such a way that the solder pads supplied with a source voltage are formed on adjacent side edges of the two modules.

It may be seen from FIG. 10 that, similarly to FIG. 8, in the case of two electrical modules 2 in a row, one of these electrical modules is arranged rotated by 180° in relation to the other electrical module 2. This results in the solder pads 8, which form a gate contact, being arranged on side edges 214 of the two modules 2 facing one another. The solder pads 6, which each form a drain contact, are formed on the side edges 212 facing away from one another. This prevents a solder pad to which a drain potential is applied from being directly adjacent to a solder pad to which a gate potential is applied. If the solder pad 8 is alternatively assigned a source potential (and the solder pad 7 is assigned a gate potential), a solder pad to which a drain potential is applied is prevented from directly adjoining a solder pad to which a source potential is applied, as shown in FIG. 8.

Figure 11:
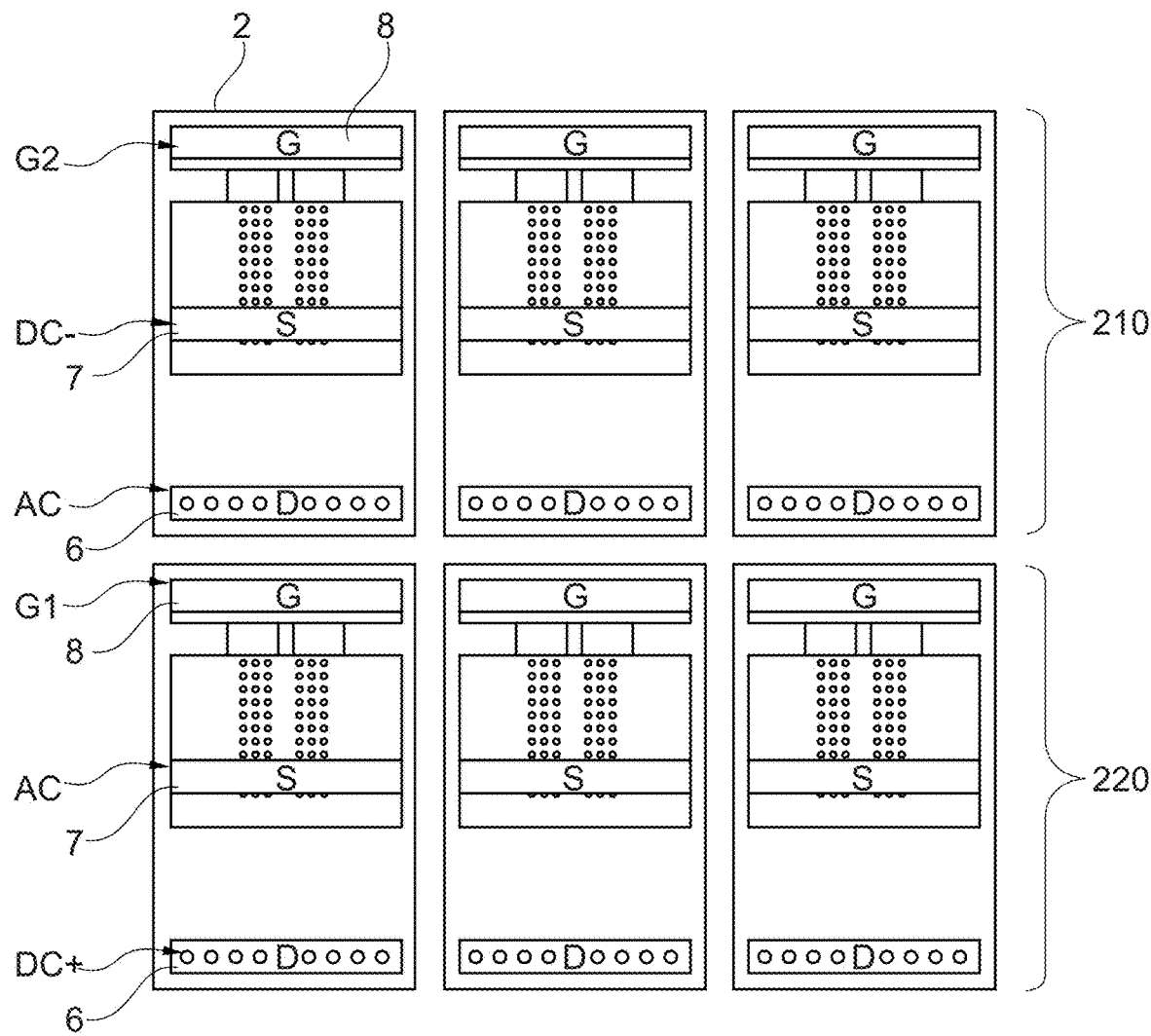
FIG. 11 depicts, in a plan view of a further arrangement of electrical modules according to FIG. 1, wherein the electrical modules are arranged in two parallel rows forming two electrical switches, and wherein the electrical modules are rotated by 90° compared to the arrangement of FIG. 9, so that the solder pads of a module of one row are each parallel to the solder pads of the adjacent module of the other row, and wherein a drain terminal and a gate terminal are opposite each other at the mutually facing side edges of the adjacent modules.
Figure 12:
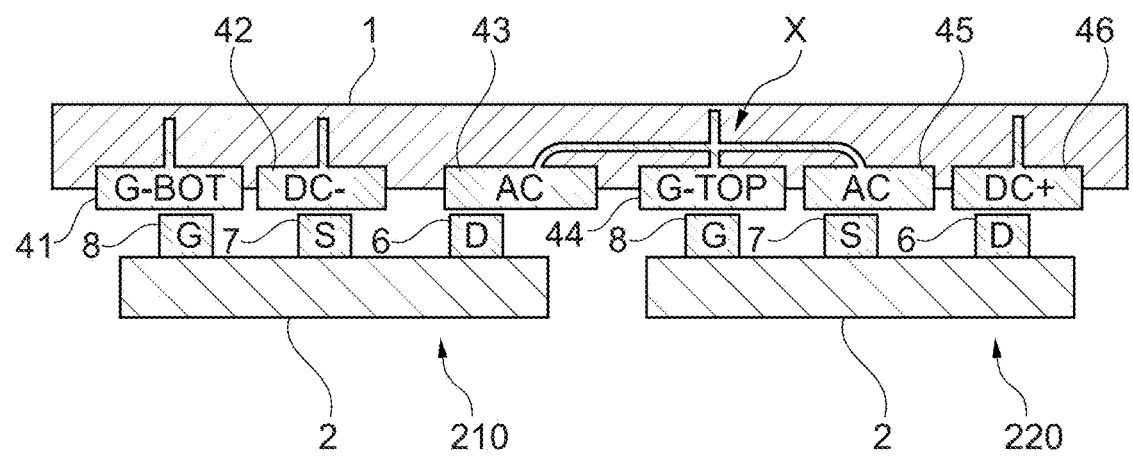
FIG. 12 depicts schematically a cross section through two adjacent modules of the two rows in FIG. 11, showing a schematic representation of a rewiring required in the circuit board.

FIGS. 11 and 12 consider two rows 210, 220 of electrical modules 2 forming an upper switch and a lower switch. The electrical modules 2 have axially symmetrical solder pads 6, 7, 8 on the upper side, as shown in the embodiment in FIG. 1. Compared to the arrangement in FIG. 9, the electrical modules are each rotated by 90°, so that a drain contact 6 of a module 2 of the upper row 210 is directly adjacent to a gate contact 8 of a module 2 of the lower row 220. This causes a problem when the switches are connected to form a half-bridge circuit, as is done in an inverter, for example.

The problem in this respect is illustrated in FIG. 12, which shows in sectional view, together with the circuit board 1 not shown in FIG. 11, a module 2 of row 110 and a module 2 of row 220. A half-bridge circuit provides that the drain contacts 6 of the modules of the upper row 210 are connected to the source contacts 7 of the module 2 of the lower row at the common AC potential. However, due to the solder pad layout, these two contacts cannot be directly short-circuited on the circuit board 1, as the gate contact 8 of the modules of the lower row 220 lies in between. The corresponding overlap in the circuit board 1 is marked schematically with X in FIG. 12. It leads to a fragmentation of the AC region in the circuit board 1 and thus to a reduction of the performance P. In particular, a rewiring in the circuit board 1 is necessary to realize the half-bridge circuit.

Figure 13:
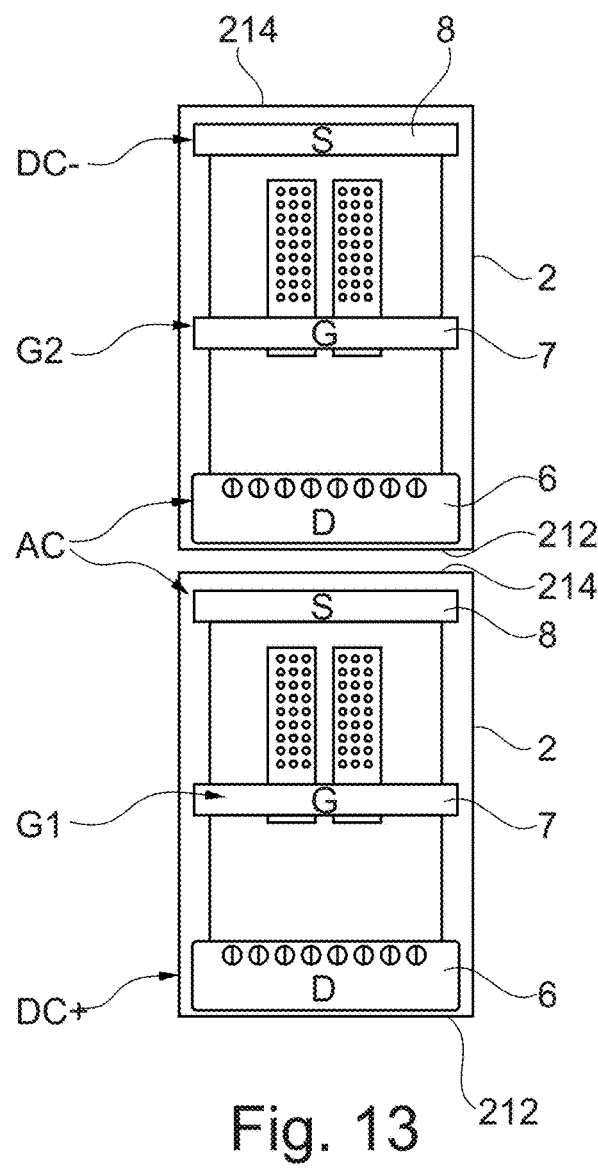
FIG. 13 depicts two electrical modules as shown in FIG. 11, arranged in two parallel rows, wherein the voltage applied to the solder pads has changed compared to FIG. 11 in that a drain terminal and a source terminal are opposite each other on the mutually facing side edges of the modules.
Figure 14:
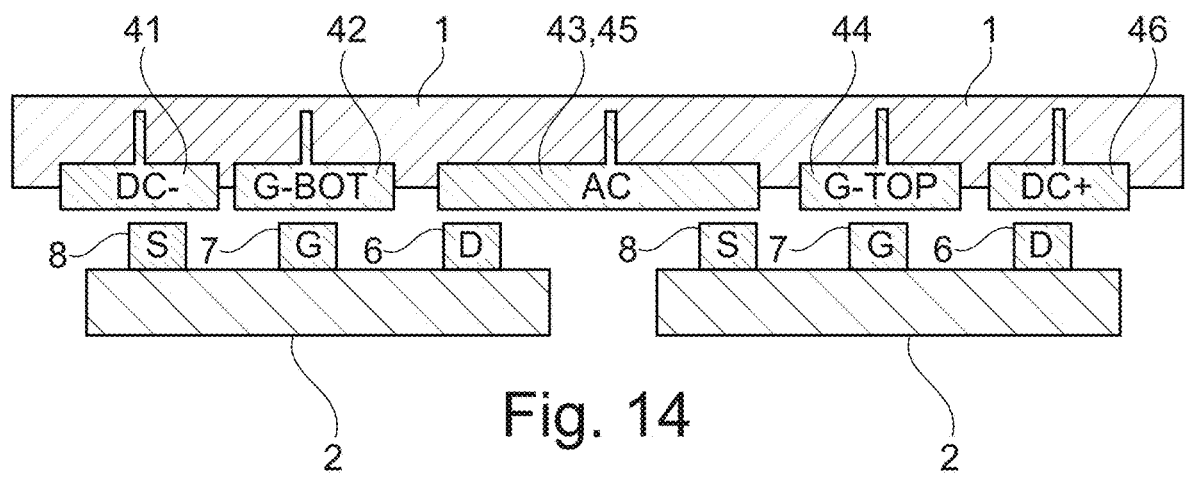
FIG. 14 depicts schematically a cross section of the two adjacent modules of FIG. 13 showing a direct connection between the drain connection of one module and the source connection of the other module via the circuit board.

According to FIGS. 13 and 14, the problem is solved by swapping the voltage applied to solder pads 7, 8. Thus, the solder pad 7 is configured as a gate contact and the solder pad 8 is configured as a source contact. As shown in FIG. 14, this means that the contacting between the drain contact and the source contact to be carried out within the framework of the half-bridge circuit may take place directly in the circuit board via the solder pad 43, 45 without any crossings.

When the voltage applied to the solder pads 7, 8 is exchanged, the electrical components or semiconductor chips embedded in the electrical modules 2 are rotated by 180°. The basic structure of the electrical module, for example as shown in FIG. 19, remains unaffected.

FIGS. 15-18 show examples of electrical modules in which solder pads on the upper side of the electrical module have an extension such that they cover the edges of the embedded electrical component, thereby reducing local field strength increases in the gap between the electrical module and the adjacent circuit board.

The underlying problem is explained again with reference to FIG. 19. The electrical component 24 shown there has a left side edge 243 and a right side edge 244. In the region of the left side edge 243, the component 24 is covered by the adjacent solder pad 7, i.e., the solder pad 7 projects beyond the left side edge 243. This is not the case at the right side edge 244, as the solder pad 8 ends before the right side edge 244 of the component 24. This results in different field strengths occurring in the gap 29 between the electrical module 2 and the circuit board 1, said gap being filled with a potting material. At the position P1, a lower electric field strength exists in the gap 29 than in the region of P2. The reason for this is that at P1 the solder pad 7 or the associated contact area covers the side edge 243 of the component 24 and thus the field lines emerge directly above the side edge 243. However, this leads to a compression of the field lines in the region P3 above the left side edge 243, which in turn results in increased field strengths in the region P3.

However, the material of the electrical module in the region of P3 is a circuit board material (e.g., prepreg material) as dielectric. This has a relatively high dielectric strength and is applied in a stable manufacturing process. Compared to the applied underfill material in gap 29, the circuit board material is therefore to be regarded as a more robust insulation material. Therefore, despite the increased values in the region P3, the field distribution in the left region P1, P3 may be better than the field distribution in the right region P2 in terms of reliability and robustness.

Based on these considerations, FIGS. 15-18 explain measures to improve the overlap of the side edges of the electrical module.

Figure 15:
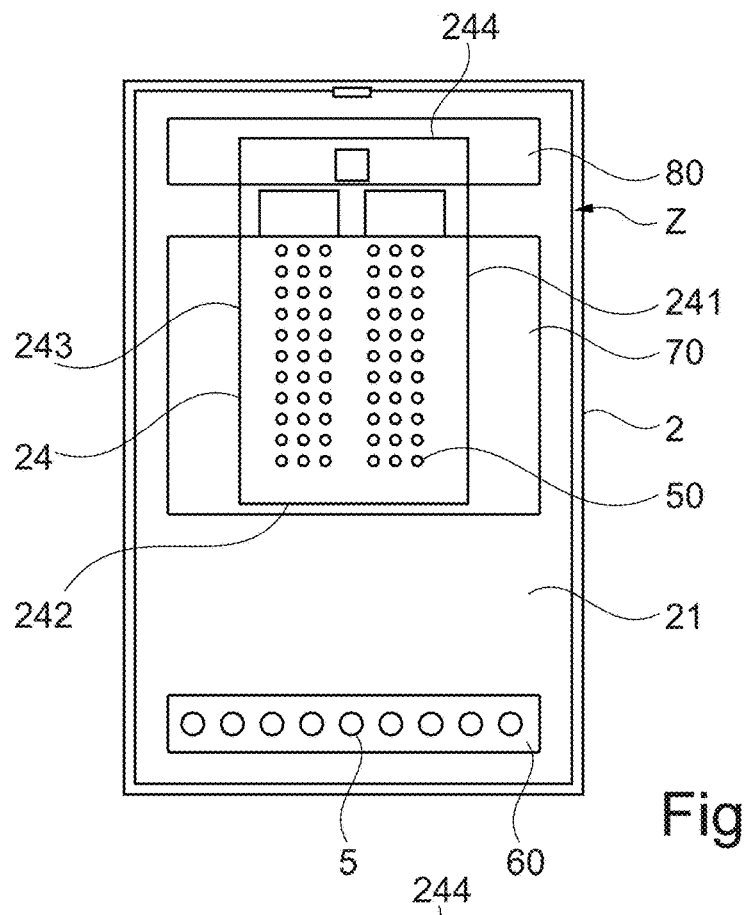
FIG. 15 depicts a plan view of the upper side of a further example of an electrical module which forms three solder pads on its upper side, wherein two of the solder pads are arranged on opposite side edges and a third solder pad is arranged over a large area in the center of the upper side, and wherein one of the solder pads arranged on the side edge and the central third solder pad partially cover the dimensions of an embedded electrical component of the electrical module.

FIG. 15 first shows an electrical module 2 which forms three solder pads 60, 70, 80 on its upper side 21. Also shown schematically is the embedded electrical component 24, which is not visible per se in the view from above, is rectangular in the view from above and accordingly has four side edges 241, 242, 243, 244, which are also referred to below as chip edges. For example, the solder pad 60 has a drain contact applied to it, the solder pad 70 has a source contact applied to it, for example, and the solder pad 80 has a gate contact applied to it, for example.

It may be seen that the solder pads 70, 80 do not completely cover the component 24. In particular, a region Z between the solder pads 70, 80 is not covered and the solder pad 70 extends substantially on the chip edge 242 without substantially covering it. This creates the problems explained with respect to FIG. 19.

Figure 16:
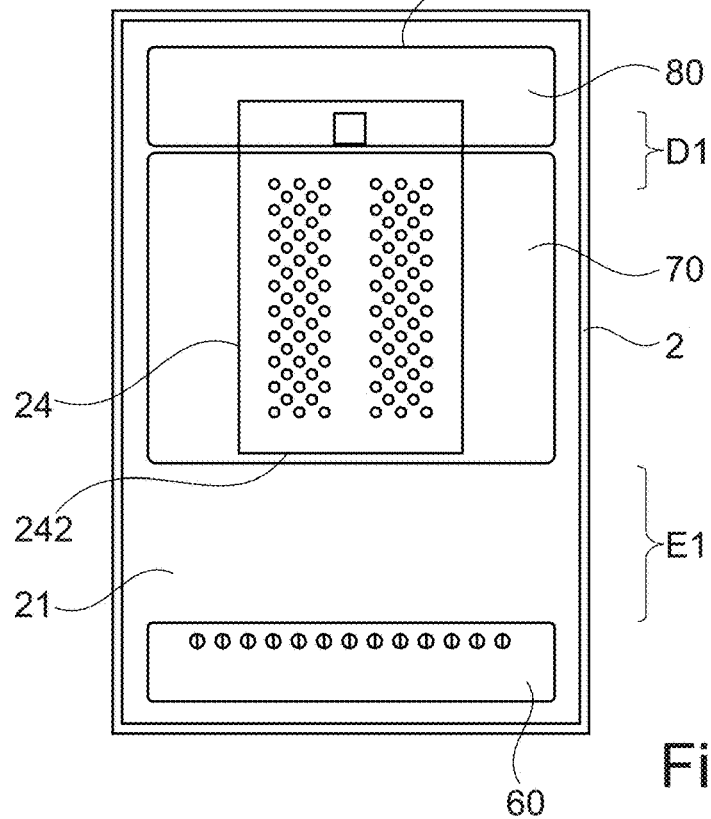
FIG. 16 depicts an electrical module according to FIG. 15, wherein the one solder pad and the central solder pad cover more than 90% of the dimensions of the embedded electrical component due to an enlarged area.

FIG. 16 shows an improved coverage of the device 24 in the region D1 where the solder pads 70, 80 have been enlarged accordingly. The region E1 denotes a relatively large clearance and creepage distance between the drain contact 60 and the source contact 70.

Figure 17:
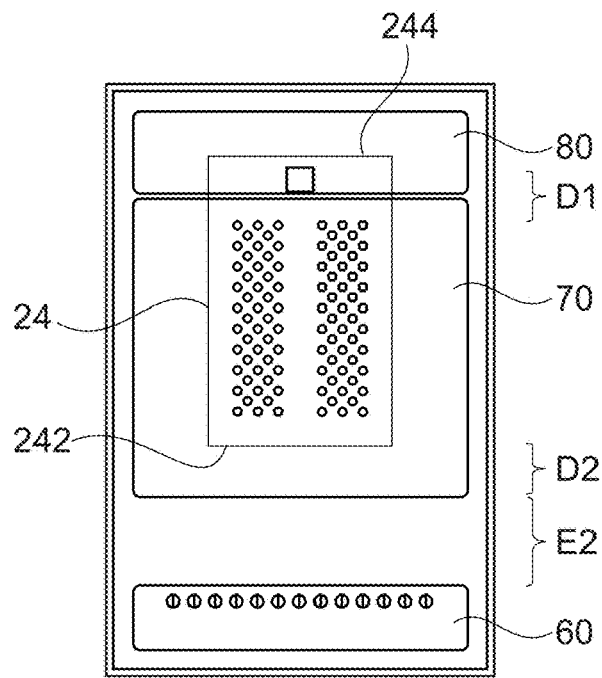
FIG. 17 depicts an electrical module according to FIG. 15, wherein the central solder pad covers the dimensions of the embedded electrical component on at least one side edge by a further enlarged area and at the same time protrudes beyond the edge of the electrical component.

FIG. 17 shows a further improved coverage of the component 24 by the solder pads 70, 80. The region D1 is covered in the same way as in FIG. 16. In addition, the solder pad 70 is enlarged so that it now also covers the component 24 in the region D2 adjacent to the chip edge 242. The region E2 concerning a clearance and creepage distance between the drain contact 60 and the source contact 70 may be reduced, since the field distribution in the gap between the electrical module and the circuit board was improved by the covering in the region D2.

Figure 18:
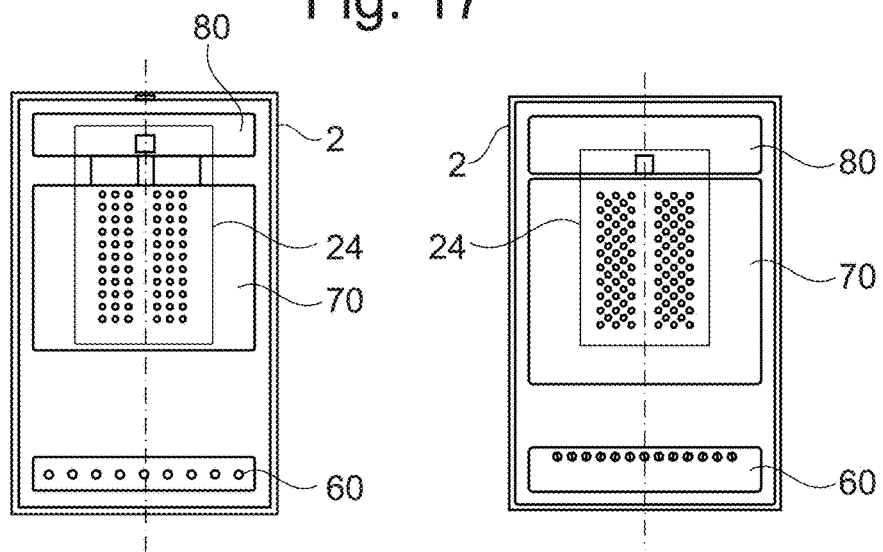
FIG. 18 depicts a comparison of an electrical module according to FIG. 15 and an electrical module of FIG. 17 in plan view and in schematic sectional view.
Figure 18:
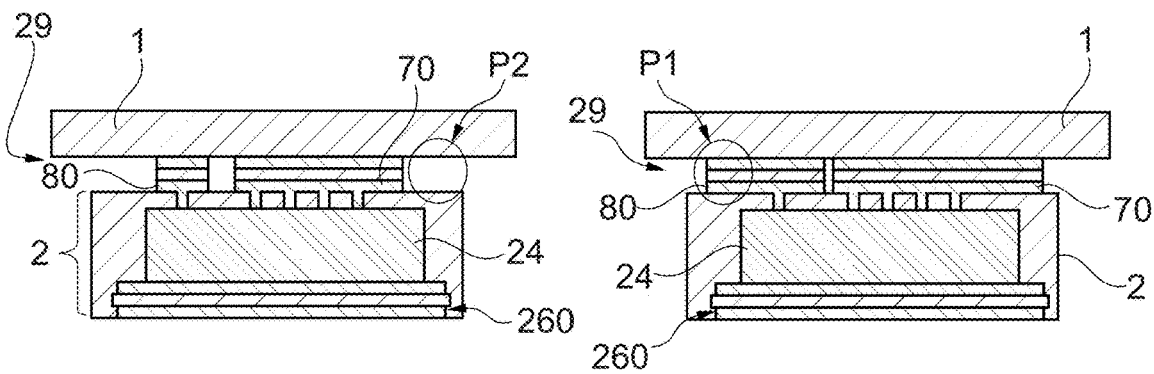

FIG. 18 shows this result once again, with the module of FIG. 15 on the left and the module of FIG. 17 on the right. The corresponding circuit boards 1 are also shown in the respective sectional views. In the case of the module of FIG. 15 (left side of FIG. 18), there is a comparatively high electric field strength in the region P2 of the gap 29, which is disadvantageous because the underfill material in the gap 29 does not have the robustness that the circuit board material of the electrical module has. In the module of FIG. 17 (right side of FIG. 18), there is a reduced electric field strength in the region P1 of the gap 29 due to the covering of the chip edges by the solder pads 70, 80 and the solder layers applied to them. This reduces the risk of partial discharges in the gap 29.

For the sake of completeness, it should be noted that the module region with the solder pad 60 is not shown in the two sectional views of FIG. 18.

It is understood that the disclosure is not restricted to the embodiments described above, and various modifications and improvements may be made without departing from the concepts described herein. It is furthermore to be noted that any of the features described may be used separately or in combination with any other features, provided that they are not mutually exclusive. The disclosure extends to and includes all combinations and sub-combinations of one or more features which are described here. If ranges are defined, these ranges therefore include all the values within these ranges as well as all the partial ranges that lie within a range.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. An electrical module comprising:
   an upper side and an underside, the upper side having four rectangularly arranged side edges;
   an electrical component embedded in the electrical module; and
   at least three electrical solder pads formed on the upper side, wherein each electrical solder pad is configured to make electrical contact with the electrical component and configured to come into contact with an associated electrical solder pad of a circuit board via a solder layer,
   wherein the at least three electrical solder pads of the electrical module: (1) are arranged in a symmetrical arrangement on the upper side of the electrical module, and/or (2) are arranged axially symmetrically on the upper side of the electrical module,
   wherein two electrical solder pads of the at least three electrical solder pads extend along two side edges of the four rectangularly arranged side edges that are opposite from a center line,
   wherein the at least three solder pads have a drain potential, a source potential, and a gate potential configured to be applied thereto,
   wherein the source potential is configured to be applied to a first electrical solder pad of the two electrical solder pads extending along a first side edge of the two side edges, and
   wherein the drain potential is configured to be applied to a second electrical solder pad of the two electrical solder pads extending along a second side edge of the two side edges.

2. The electrical module of claim 1, wherein the at least three electrical solder pads are elongate and at least two electrical solder pads of the at least three electrical solder pads are arranged parallel to each other.

3. The electrical module of claim 1, wherein three electrical solder pads of the at least three electrical solder pads are arranged axially symmetrically on the upper side of the electrical module such that one electrical solder pad of the three electrical solder pads extends along the center line and two other electrical solder pads of the three electrical solder pads extend along the side edges of the four rectangularly arranged side edges that are opposite the center line.

4. The electrical module of claim 1, wherein the at least three electrical solder pads comprise four electrical solder pads, and
   wherein the four electrical solder pads are arranged axially symmetrically on the upper side of the electrical module such that two electrical solder pads of the four electrical solder pads extend adjacent to the center line and two additional electrical solder pads of the four electrical solder pads extend along the side edges of the four rectangularly arranged side edges that are opposite the center line.

5. The electrical module of claim 1, wherein all electrical solder pads of the at least three electrical solder pads extend along the two opposite side edges of the four rectangularly arranged side edges such that a same number of electrical solder pads extend along the two opposite side edges in each case.

6. The electrical module of claim 1, wherein each electrical solder pad of the at least three electrical solder pads has a same area.

7. The electrical module of claim 1, wherein all electrical solder pads of the at least three electrical solder pads extend along the two opposite side edges of the four rectangularly arranged side edges such that one electrical solder pad is arranged on the first side edge of the two opposite side edges and the other electrical solder pads are arranged one behind another along the second side edge of the two opposite side edges.

8. The electrical module of claim 7, wherein a sum of areas of the other electrical solder pads extending on the second side edge is equal to an area of the one electrical solder pad extending on the first side edge.

9. The electrical module of claim 1, wherein vias extend from the at least three electrical solder pads into an interior of the electrical module and extend to an inner metallization layer of the electrical module or to contacts on an upper side of the electrical component.

10. An electrical module comprising:
an upper side and an underside, the upper side having four rectangularly arranged side edges;
an electrical component embedded in the electrical module;
at least three electrical solder pads formed on the upper side, wherein each electrical solder pad is configured to make electrical contact with the electrical component and configured to come into contact with an associated electrical solder pad of a circuit board via a solder layer, wherein the at least three electrical solder pads of the electrical module: (1) are arranged in a symmetrical arrangement on the upper side of the electrical module, and/or (2) are arranged axially symmetrically on the upper side of the electrical module; and
a ceramic circuit carrier having an insulating ceramic layer and a first metallization layer disposed on an upper side of the ceramic layer,
wherein the electrical component is disposed on and electrically connected to an upper side of the first metallization layer, and
wherein the electrical contacts of the electrical module comprise at least one first via that extends from a first electrical solder pad of the at least three electrical solder pads on the upper side of the electrical module to the first metallization layer, and second and third vias that extend from additional electrical solder pads of the at least three electrical solder pads on the upper side of the electrical module to corresponding contacts on the upper side of the electrical component.

11. The electrical module of claim 1, wherein the electrical component is a semiconductor component.

12. A circuit board assembly comprising:
a circuit board having an upper side and an underside;
a plurality of electrical modules connected to the circuit board, wherein each electrical module of the plurality of electrical modules has an upper side and an underside, wherein the upper side of the electrical module is arranged on the underside of the circuit board,
wherein the upper side of each electrical module of the plurality of electrical modules has four rectangularly arranged side edges,
wherein an electrical component is embedded in each electrical module of the plurality of electrical modules; and
wherein at least three electrical solder pads are positioned on the upper side on each electrical module of the plurality of electrical modules, wherein each electrical solder pad is configured to make electrical contact with the electrical component, and wherein at least one solder pad of the at least three electrical solder pads extends on each edge of two opposite side edges of the four rectangularly arranged side edges,
wherein additional electrical solder pads are positioned on an underside of the circuit board and are connected with the at least three electrical solder pads on the upper side of the electrical module via respective solder layers, and
wherein the at least three electrical solder pads of each electrical module of the plurality of electrical modules: (1) are arranged in a symmetrical arrangement on the upper side of the electrical module, and/or (2) are arranged axially symmetrically on the upper side of the electrical module,
wherein the plurality of electrical modules is arranged in two rows on the circuit board and in each case two adjacent electrical modules of the two rows being aligned such that the side edges provided with electrical solder pads are aligned with one another and extend perpendicularly to a longitudinal direction of the respective row of the two rows,
wherein a washing agent is configured to flow through each electrical module of two adjacent electrical modules of the two rows at an intermediate stage of a manufacture of the circuit board assembly, and
wherein a flow of the washing agent flow is configured to extend between the circuit board and the upper side of the respective electrical module and thereby between the electrical solder pads positioned on the two opposite side edges.

13. The circuit board assembly of claim 12, wherein each electrical module of the plurality of electrical modules has a first electrical solder pad extending along a center line and second and third electrical solder pads extending along the two opposite side edges, and
wherein two adjacent electrical modules of each row of the two rows are aligned such that the solder pads extending along the center lines of the two adjacent electrical modules are aligned with each other.

14. The circuit board assembly of claim 12, wherein the at least three solder pads of each electrical module of the plurality of electrical modules have a source potential, a drain potential, and a gate potential configured to be applied thereto, and
wherein two adjacent electrical modules of a row are aligned such that an electrical solder pad arranged on one side edge of a first electrical module of the two adjacent electrical modules to which the source potential is configured to be applied does not adjoin an electrical solder pad arranged on an adjacent side edge of a second electrical module of the two adjacent electrical modules to which the drain potential is configured to be applied.

15. The circuit board assembly of claim 12, wherein a first electrical module of two adjacent electrical modules of a row is arranged rotated by 180° relative to a second electrical module of the two adjacent electrical modules.

16. The circuit board assembly of claim 12, wherein the at least three electrical solder pads of each electrical module of the plurality of electrical modules have a source potential, a drain potential, and a gate potential configured to be applied thereto,
- wherein the source potential is configured to be applied to a first electrical solder pad of the at least three electrical solder pads extending along a first side edge of two side edges,
- wherein the drain potential is configured to be applied to a second electrical solder pad of the at least three electrical solder pads extending along a second side edge of the two side edges,
- wherein, in each case, two adjacent electrical modules of the two rows are aligned such that the first electrical solder pad of a first electrical module of the two adjacent electrical modules to which the drain potential is applied, arranged on the first side edge, adjoins the second electrical solder pad on an adjacent side edge of a second electrical module of the two adjacent electrical modules to which the source potential is applied.

17. The circuit board assembly of claim 16, wherein electrical modules of the plurality of electrical modules arranged in a row each form a logic switch.

18. The circuit board assembly of claim 17, wherein each logic switch is interconnected via a corresponding wiring in the circuit board to form a half-bridge circuit in which a drain contact of one logic switch and a source contact of another switch are at a same potential.

* * * * *